US009873555B2

(12) United States Patent
Mariani et al.

(10) Patent No.: US 9,873,555 B2
(45) Date of Patent: Jan. 23, 2018

(54) CARRIER TAPE COMPRISING POCKETS INCLUDING A BASE BOTTOM PORTION AND A RAISED BOTTOM PORTION

(71) Applicant: Infineon Technologies AG, Neubiberg (DE)

(72) Inventors: Franco Mariani, Pentling-Neudorf (DE); Christoph Ahamer, Villach (AT); Corneleus Esguerra Caunan, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/459,420

(22) Filed: Mar. 15, 2017

(65) Prior Publication Data

US 2017/0283144 A1 Oct. 5, 2017

(30) Foreign Application Priority Data

Mar. 30, 2016 (DE) .................. 10 2016 105 787

(51) Int. Cl.
| H01L 23/02 | (2006.01) |
| B65D 85/00 | (2006.01) |
| B65D 73/02 | (2006.01) |
| H01L 23/053 | (2006.01) |
| H01L 23/10 | (2006.01) |

(52) U.S. Cl.
CPC ............ B65D 73/02 (2013.01); H01L 23/053 (2013.01); H01L 23/10 (2013.01)

(58) Field of Classification Search
CPC ........ B65D 73/02; H01L 23/053; H01L 23/10
USPC .......... 257/678, 685, E23.055; 206/713, 714
See application file for complete search history.

(56) References Cited

U.S. PATENT DOCUMENTS

| 5,234,104 A * | 8/1993 | Schulte ................. B65D 73/02 206/341 |
| 5,913,425 A * | 6/1999 | Thomas ............... H05K 13/003 206/714 |
| 6,047,832 A * | 4/2000 | Raschke ................ B65D 73/02 206/714 |
| 6,270,614 B1 | 8/2001 | Naito et al. |
| 2004/0011700 A1* | 1/2004 | Brahmbhatt ....... H05K 13/0084 206/713 |
| 2004/0181938 A1* | 9/2004 | Suzuki ................. G05B 19/128 29/832 |
| 2015/0158649 A1 | 6/2015 | Huang et al. |

FOREIGN PATENT DOCUMENTS

WO 2013/025402 2/2013

* cited by examiner

*Primary Examiner* — Jami M Valentine
(74) *Attorney, Agent, or Firm* — Dicke, Billig & Czaja, PLLC

(57) ABSTRACT

A carrier tape comprises a flexible body portion having a top surface. The flexible body portion comprises a plurality of pockets. Each of the plurality of pockets comprises pocket side walls, a base bottom portion fully circulating a raised bottom portion of a pedestal. The pedestal is made up of the raised bottom portion and pedestal side walls. The pedestal sidewalls, the base bottom portion and a lower part of the pocket side walls constitute a trench fully circulating the pedestal.

10 Claims, 5 Drawing Sheets

CARRIER TAPE COMPRISING POCKETS INCLUDING A BASE BOTTOM PORTION AND A RAISED BOTTOM PORTION

CROSS-REFERENCE TO RELATED APPLICATION

This Utility Patent Application claims priority to German Patent Application No. 10 2016 105 787.8, filed Mar. 30, 2016; which is incorporated herein by reference.

BACKGROUND

In the semiconductor industry, devices are shipped to customers in various packaging configurations. Apart from encapsulated dies, for example ceramic- or plastic-encapsulated dies, also bare dies are shipped to customers. One example of bare die shipping is based on tape and reel packaging systems. In the tape and reel format, components are placed in specifically designed pockets embossed in a carrier tape body. The pockets may be sealed with a cover tape to hold components placed in the pockets. Sprocket holes may be provided along one or both margins of the carrier tape to enable the tape to be moved by automated equipment. The tape is wound onto a plastic reel for labeling and packaging before shipment.

When shipping bare dies in carrier tapes, mechanical stress on the bare dies caused during placement and transport should be minimized for avoiding any damage of the bare dies.

It is thus desirable to improve a carrier tape for bare die shipping in this regard.

SUMMARY

The present disclosure relates to a carrier tape. The carrier tape comprises a flexible body portion having a top surface. The flexible body portion comprises a plurality of pockets. Each of the plurality of pockets comprises pocket side walls, a base bottom portion fully circulating a raised bottom portion and a pedestal. The pedestal is made up of the raised bottom portion and pedestal side walls. The pedestal sidewalls, the base bottom portion and a lower part of the pocket side walls constitute a trench fully circulating the pedestal.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. The drawings are not necessarily to scale. Different spatial axes may have different scales.

DETAILED DESCRIPTION

Figure 1:
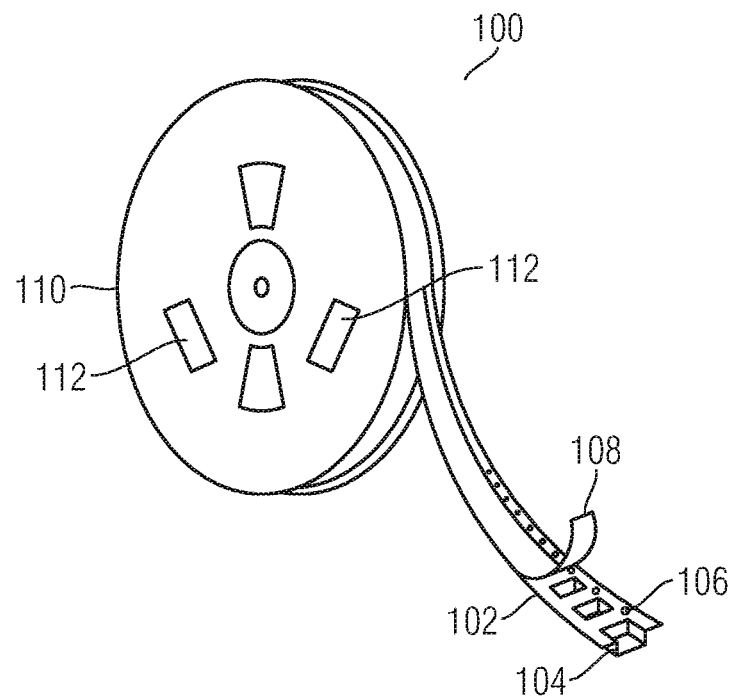
FIG. 1 is a schematic view of a tape and reel packaging component.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In embodiments disclosed herein one or more conductive layers, in particular electrically conductive layers such as metal layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into a plurality of semiconductor or bare dies (individual chips). Any technique for dicing may be applied, e.g., blade dicing (sawing), laser dicing, etching.

FIG. 1 is a schematic illustration of a tape and reel packaging system 100. The tape and reel packaging system 100 comprises a carrier tape 102. Exemplary materials for carrier tapes include plastic materials, for example polycarbonate or polystyrene. Carrier tapes with varying conductive and anti-static qualities to suit different applications are widely available. The carrier tape 102 comprises pockets 104 for housing a component. The pockets 104 may be embossed into the carrier tape 102, for example. Sprocket holes 106 may be provided along one or both margins of a top surface of the carrier tape 102. The sprocket holes 106 enable precise detection of the pockets 104 by a pick and place unit. The pockets 104 may be sealed with a cover tape 108 to hold components placed in the pockets 104. Typical examples of cover tapes include heat-activated adhesive (HAA) cover tapes and pressure-sensitive adhesive (PSA) cover tapes. In the taping process of HAA cover tapes, a heated sealing shoe presses the cover tape onto the edges of the carrier tape, thereby sealing the cover tape to the carrier tape. In the HAA taping process, time, heat, and pressure are controlled for achieving optimum adhesion. In the taping process of PSA cover tapes, the cover tape adheres when pressure is applied. Heat is not required to activate the bond in the PSA taping process. The carrier tape 102 sealed by the cover tape 108 is wound onto a reel 110. Labels 112 may be placed on the reel 110 comprising any kind of information, for example customer name, device part number, product date code, and quantity in the reel. Bar codes may be part of the labels.

Figure 2A:
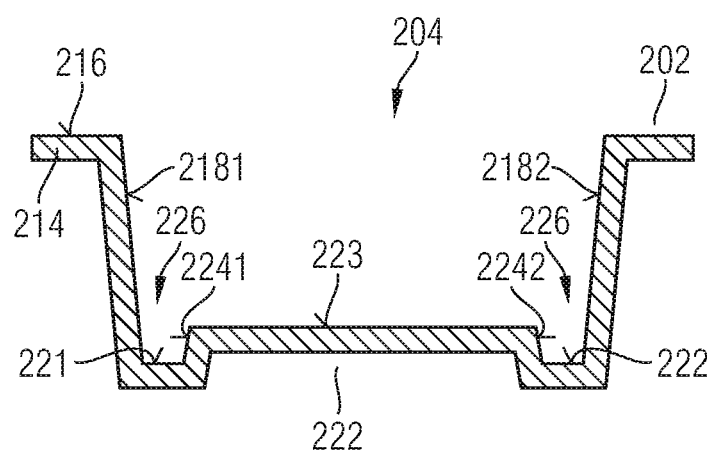
FIG. 2A is a schematic cross-sectional view of a carrier tape according to an embodiment.

The schematic cross-sectional view of FIG. 2A illustrates a carrier tape 202 according to an embodiment.

The carrier tape 202 includes a flexible body portion 214 having a top surface 216. A pocket 204 in the flexible body portion 214 includes pocket side walls 2181, 2182 and a base bottom portion 2201, 2202. The pocket 204 further includes a pedestal 222 made up of a raised bottom portion 223 and pedestal side walls 2241, 2242. The pedestal side walls 2241, 2242, the base bottom portion 2201, 2202 and a lower part of the pocket side walls 2181, 2182 constitute a trench 226.

Figure 2B:
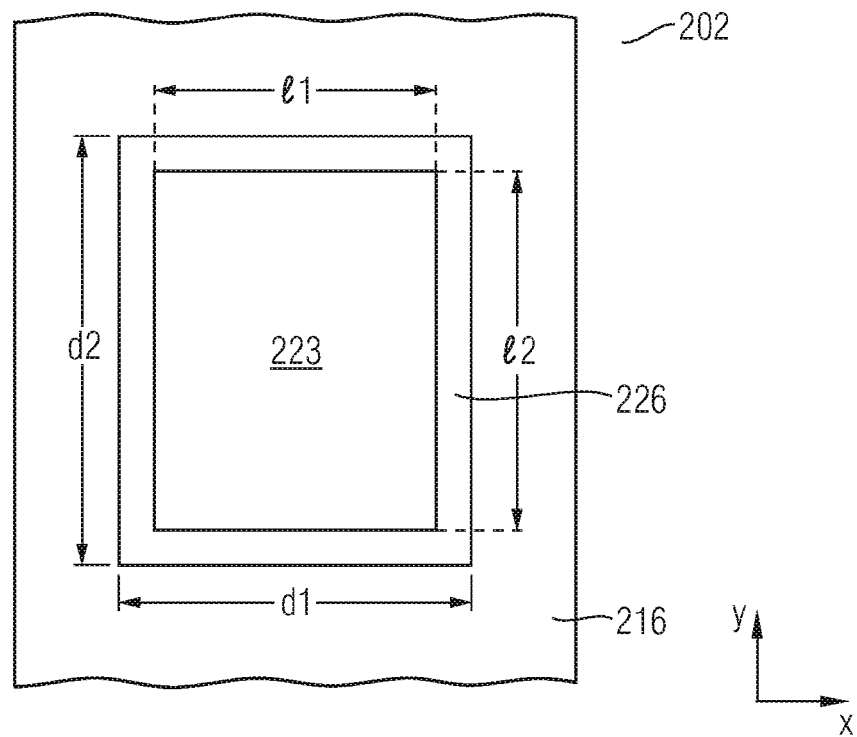
FIG. 2B is a top view of a carrier tape according to an embodiment.

The schematic cross-sectional view of FIG. 2B illustrates a schematic top view of the carrier tape 202 of FIG. 2B, wherein the trench 226 fully circulates the raised bottom portion 223 of the pedestal 222.

The carrier tape 202 illustrated in FIGS. 2A and 2B allows for a beneficial placement of bare dies in the pockets 204. The bare dies may be placed on the raised bottom portion 223 of the pedestal 222 with a contact surface, for example a part of a back side surface of the bare die. The back side surface of the bare die may be a surface of a metal contact, for example a load terminal contact, e.g. a drain contact of an insulated gate field effect transistor (IGFET) such as a metal oxide semiconductor field effect transistor (MOSFET), an anode or cathode contact of a diode or a thyristor, a collector contact of an insulated gate bipolar transistor (IGBT) or a bipolar junction transistor (BJT). A dicing process of a wafer resulting in bare dies to be shipped to a customer in a tape and reel system may lead to metal flitters at a back side of the bare die. The metal flitters may be caused by a sawing process cutting through the semiconductor body and a metal layer, for example a contact layer at a back side of the bare die. Metal flitters attached to the semiconductor body are thus located at edges and corners. Mechanical strain, for example caused by placing the bare dies into the pockets by a pick and place unit or by movement or vibration during shipping may cause the metal flitters to be detached from or protrude from the surface of the bare die. This may lead to undesired drawbacks, for example short circuits on a wiring board. When placing the bare dies on the raised bottom portion 223 of the pedestal 222, a contact of the edges and corners of the bare dies with the carrier tape may be minimized or avoided. Hence, a contact of metal flitters at edges or corners of a metal back surface of the bare dies with the carrier tape may be avoided or minimized, thereby reducing or avoiding undesired detachment or protrusion of the metal flitters caused by movement or vibration during shipping.

In some embodiments, the raised bottom portion 223 is a flat contact portion configured to support a bare die positioned thereon. By way of example, the bare dies may be positioned on the raised bottom portion via an outermost metal layer.

In some embodiments, the carrier tape 202 includes an adhesive on the flat contact portion. Thereby, a cover tape may be dispensed with. The adhesive may be an adhesive tape on at least a part of the flat contact portion. In some embodiments, an overall area of the flat contact portion may be covered by the adhesive. In some other embodiments, a part of the flat contact portion may be covered by the adhesive, for example stripes or islands of adhesive tape may be provided on the flat contact portion.

In the schematic top view of FIG. 2B, a distance between pocket sidewalls facing one another along a first lateral direction x is denoted by d1. A distance between pocket sidewalls facing one another along a second lateral direction y is denoted by d2. In some embodiments, a dimension l1 of the raised bottom portion along the first lateral direction x is in a range of 70% to 80% of the distance d1 between the pocket sidewalls facing one another along the first lateral direction x. In some embodiments, a dimension l2 of the raised bottom portion along the second lateral direction y is in a range of 70% to 80% of the distance d2 between the pocket sidewalls facing one another along the second lateral direction y. In the top view of FIG. 2B, the raised bottom portion 223 and the trench 226 are illustrated with respect to a same vertical level, for example a sectional plane having the raised bottom portion 223 as part thereof.

The pocket side walls 2181, 2182 may include flat, curved and/or stepped side wall portions. In some embodiments, the pocket side walls 2181, 2182 include curved side wall portions at a top portion of the pocket side walls 2181, 2182 in a transition region between the pocket side walls 2181, 2182 and the top surface of the flexible body portion.

In some embodiments, the pocket side walls 2181, 2182 include curved side wall portions at a bottom portion of the pocket side walls 2181, 2182 in a transition region between the pocket side walls 2181, 2182 and base bottom portion.

Figure 3:
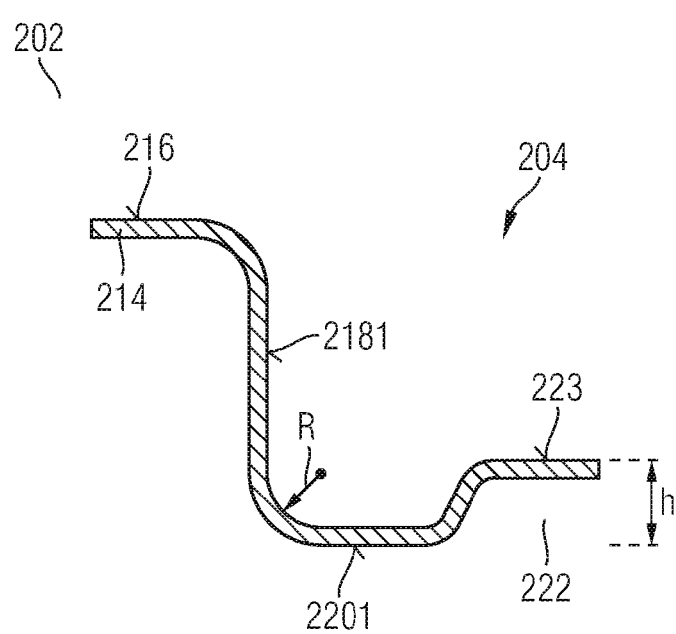
FIG. 3 is a schematic cross-sectional view of a carrier tape including a curved side wall part at a bottom portion of the pocket side walls.

Referring to the schematic cross-sectional view of an embodiment of the carrier tape 202 illustrated in FIG. 3, a curvature radius R of the bottom portion of the pocket side wall 2181 in a transition region between the pocket side wall 2181 and the bottom base portion 2201 is equal to or smaller than a height h of the pedestal 222. This serves to avoid contact between metal burrs at an edge of bare dies and the carrier tape.

In some embodiments, the carrier tape further comprises a linear corner relief portion at the corners of the pockets, the linear corner relief portion expanding the pockets in the corners by at least four linear side wall portions, wherein the linear side wall portions of any neighboring two of the at least four linear side wall portions extend in different lateral directions.

Figure 4A:
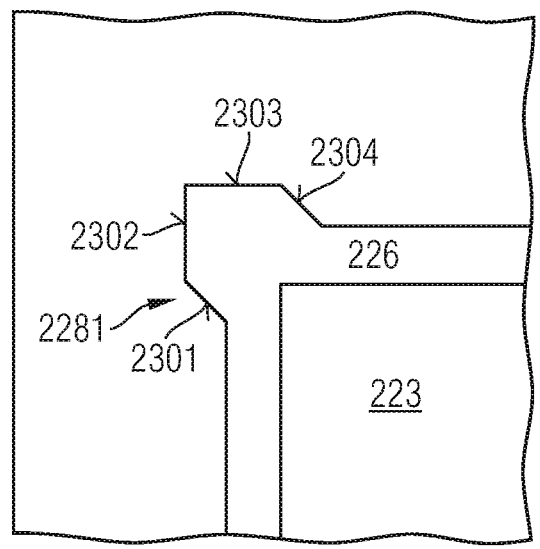
FIG. 4A is a top view of a linear corner relief portion of a carrier tape according to an embodiment.

In the schematic top view of FIG. 4A, an embodiment of a linear corner relief portion 2281 including four linear side wall portions 2301, 2301, 2303, 2304 is illustrated.

Figure 4B:
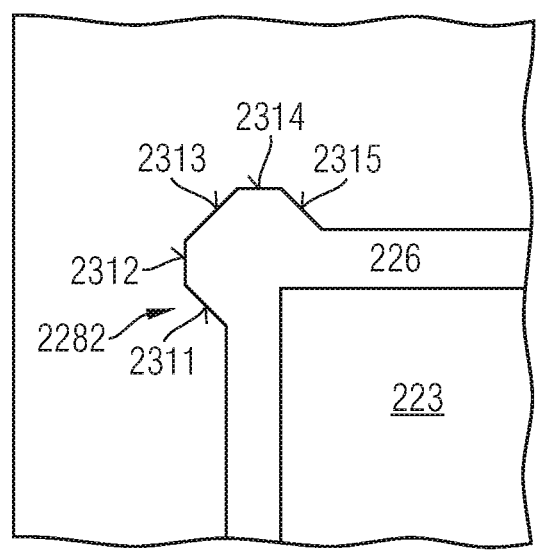
FIG. 4B is a top view of a linear corner relief portion of a carrier tape according to another embodiment.

In the schematic top view of FIG. 4B, an embodiment of a linear corner relief portion 2282 including five linear side wall portions 2311, 2312, 2313, 2314, 2315 is illustrated.

In other embodiments, corner relief portions having a number of linear side wall portions different from four and five as illustrated in FIGS. 4A, 4B may be provided, for example corner relief portions having six, seven, eight, nine or even more linear side wall portions. The corner relief portions may be arranged at all of the corners of the pockets 204, for example.

Figure 5A:
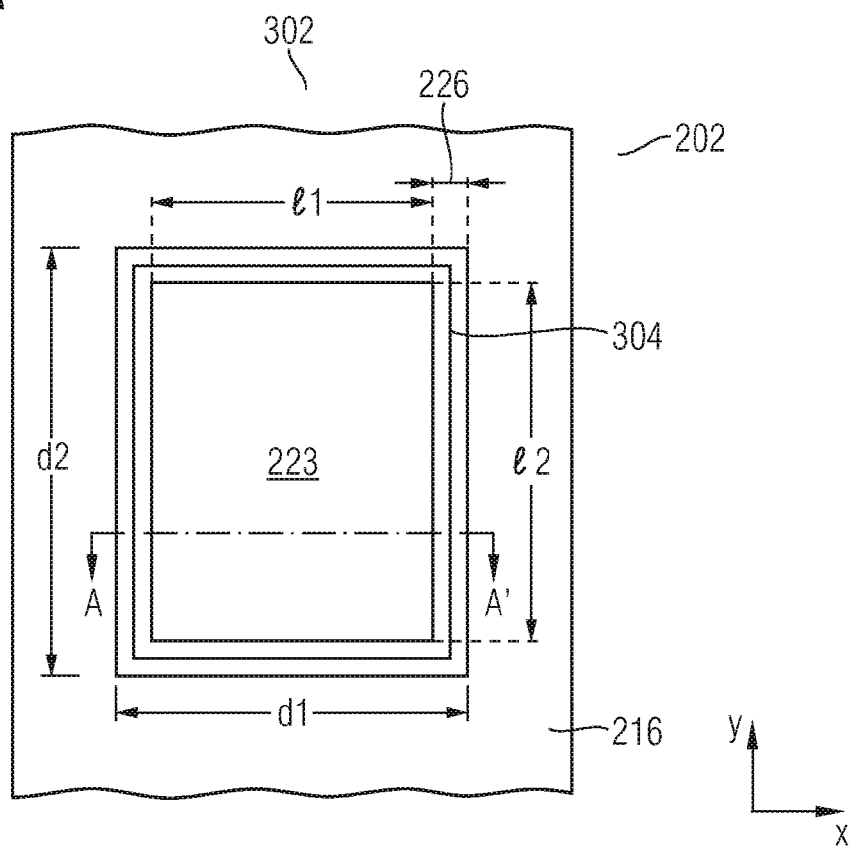
FIG. 5A is a schematic top view of a packaged semiconductor component according to an embodiment.

The schematic top view of FIG. 5A illustrates an embodiment of a packaged semiconductor component 302. The packaged semiconductor component 302 includes the carrier tape 202 as described with respect to any one of the embodiments described above, and a bare die 304 in one of the pockets 204. Other bare dies than the one illustrated in FIG. 5A may be placed in other pockets of the carrier tape 202. Edges and corners of the bare die 304, when projected on a plane of the raised bottom portion, i.e. when projected on a plane at a level of the raised bottom portion and including the raised bottom portion as part thereof, are fully outside a projection area of the raised bottom portion 223 of the pedestal 222.

Figure 5B:
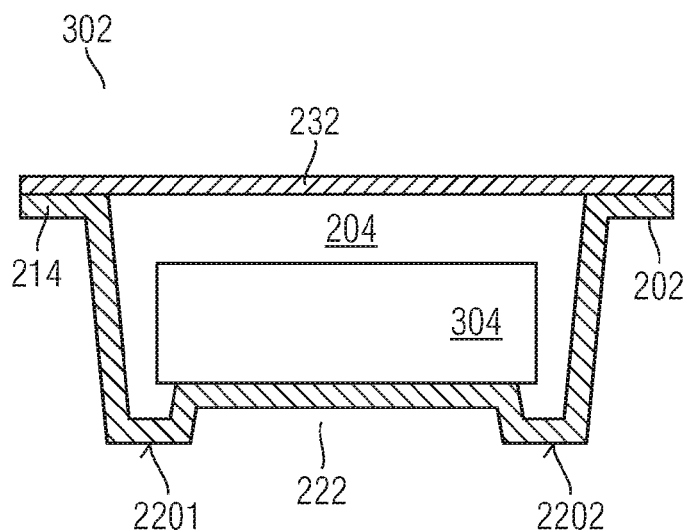
FIG. 5B is a schematic cross-sectional view of the packaged semiconductor component of FIG. 5A along cut line A-A', wherein the carrier tape is sealed by a cover tape.

FIG. 5B is a cross-sectional view of an embodiment of a packaged semiconductor component 302 along a cut line A-A' of FIG. 5A. The bare die is placed on the raised bottom portion 223 of the pedestal 222 via part of a metal layer contact surface. In the embodiment of FIG. 5B, a cover tape 232 seals the pocket 204.

Figure 5C:
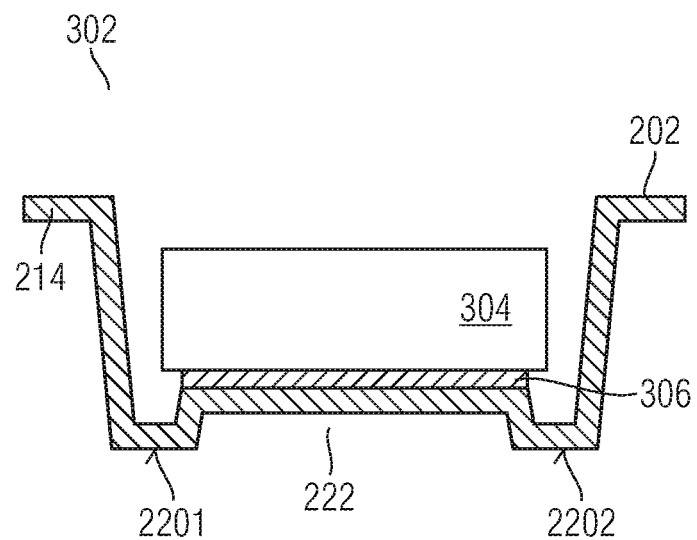
FIG. 5C is a schematic cross-sectional view of the packaged semiconductor component of FIG. 5A along cut line A-A', wherein the semiconductor die is attached to the pedestal of the carrier tape via an adhesive.

FIG. 5C is a cross-sectional view of another embodiment of a packaged semiconductor component 302 along cut line A-A' of FIG. 5A. The bare die is placed on the raised bottom portion of the pedestal 222 via part of a metal layer contact surface and attached via an adhesive 306 between the raised bottom portion 223 of the pedestal 222 and the bare die 304.

In some embodiments, a vertical power semiconductor device is formed in the bare die. The vertical power semiconductor device comprises load terminal contacts at opposite sides of the bare die 304. In some embodiments, the vertical power semiconductor device is an insulated gate field effect transistor, or an insulated gate bipolar transistor, or a diode, or a thyristor, or a bipolar junction transistor.

The embodiments disclosed herein may be combined.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A carrier tape, comprising:
   a flexible body portion having a top surface;
   a plurality of pockets in the flexible body portion, wherein each of the plurality of pockets comprises:
   pocket side walls;
   a base bottom portion fully circulating a raised bottom portion;
   a pedestal made up of the raised bottom portion and pedestal side walls, wherein the pedestal sidewalls, the base bottom portion and a lower part of the pocket side walls constitute a trench fully circulating the pedestal; and further comprising
   a linear corner relief portion at the corners of the pockets, the linear corner relief portion expanding the pockets in the corners by at least four linear side wall portions, wherein the linear side wall portions of any neighboring two of the at least four linear side wall portions extend in different lateral directions.

2. The carrier tape of claim 1, wherein the raised bottom portion is a flat contact portion configured to support a bare die positioned thereon.

3. The carrier tape of claim 2, further comprising an adhesive on the flat contact portion.

4. The carrier tape of claim 3, wherein the adhesive is an adhesive tape on at least a part of the flat contact portion.

5. The carrier tape of claim 1, wherein a distance between pocket sidewalls facing one another along a first lateral direction is d1, a distance between pocket sidewalls facing one another along a second lateral direction is d2, and a dimension l1 of the raised bottom portion along the first lateral direction is in a range of 70% to 80% of d1, and a dimension l2 of the raised bottom portion along the second lateral direction is in a range of 70% to 80% of d2.

6. The carrier tape of claim 1, further comprising a curved side wall part at a bottom portion of the pocket side walls in a transition region between the pocket side walls and the bottom base portion, wherein a curvature radius of the bottom portion of the pocket side walls is equal to or smaller than a height of the pedestal.

7. A packaged semiconductor component, comprising:
   the carrier tape according to any one of the preceding claims; and
   a bare die in at least one of the pockets, wherein edges and corners of the bare die, when projected on a plane of the raised bottom portion, are fully outside the raised bottom portion.

8. The packaged semiconductor component of claim 7, wherein the bare die is placed on the raised bottom portion via part of a metal layer contact surface.

9. The packaged semiconductor component of claim 7, wherein a vertical power semiconductor device is formed in the bare die, the vertical power semiconductor device comprising load terminal contacts at opposite sides of the bare die.

10. The packaged semiconductor component of claim 7, wherein the vertical power semiconductor device is an insulated gate field effect transistor, or an insulated gate bipolar transistor, or a diode, or a thyristor, or a bipolar junction transistor.

* * * * *